United States Patent [19]
Imai et al.

[11] Patent Number: 5,864,945
[45] Date of Patent: *Feb. 2, 1999

[54] AXIAL TYPE ELECTRONIC COMPONENT INSERTING METHOD AND APPARATUS

[75] Inventors: Kiyoshi Imai; Hideaki Watanabe, both of Kofu; Hiromi Kinoshita, Kitakyushu, all of Japan

[73] Assignee: Matsushita Electic Industrial Co., Ltd., Osaka, Japan

[ * ] Notice: The portion of the term of this patent subsequent to Nov. 5, 2016, has been disclaimed.

[21] Appl. No.: 659,398

[22] Filed: Jun. 6, 1996

[30] Foreign Application Priority Data

Jun. 7, 1995 [JP] Japan .................................. 7-139779

[51] Int. Cl.$^6$ ............................. H05K 3/30; B23P 23/00
[52] U.S. Cl. ...................... 29/838; 29/564.6; 29/566.2; 29/741; 29/845
[58] Field of Search .................................. 29/741, 566.3, 29/566.1, 564.6, 838

[56] References Cited

U.S. PATENT DOCUMENTS

| | | | |
|---|---|---|---|
| 3,593,404 | 7/1971 | Ragard | 29/741 X |
| 3,597,824 | 8/1971 | Yoshida et al. | 29/741 X |
| 4,202,092 | 5/1980 | Shibasaki et al. | 29/741 |
| 4,313,251 | 2/1982 | Asai et al. | 29/564.6 |
| 4,635,341 | 1/1987 | Staudinger | 29/741 |
| 4,750,263 | 6/1988 | Yagi et al. | 29/741 |
| 5,701,662 | 12/1997 | Imai et al. | 29/838 X |

FOREIGN PATENT DOCUMENTS 01305600   8/1989   Japan .

Primary Examiner—Carl J. Arbes
Attorney, Agent, or Firm—Wenderoth, Lind & Ponack, L.L.P.

[57] ABSTRACT

An inserting apparatus inserts, into specified holes of a board, an axial type electronic component having a pair of lead wires extending from a main body and belonging to an assembly of electronic components which are connected by a tape and arranged at regular intervals. The apparatus includes chucks constructed so that the chucks can move forward and backward while grasping end portions of the axial type electronic component. A component carrying device is provided with the chucks and arranged at regular intervals in a circular form, each operating intermittently so that each chuck stops at least in a component supplying position and a component transferring position. A component supplying device is provided with a cutter for cutting the tape connecting the assembly of axial type electronic components, and operates to supply each axial type electronic component to each chuck located in the component supplying position. A component transferring device receives each axial type electronic component from each chuck located in the component transferring position and transfers the axial type electronic component to a component inserting position. A component inserting device receives the axial type electronic component from the component transferring device in the component inserting position, inserts both the ends of the lead wires into the specified holes of the board, and bends the lead wires underneath the board so as to fix the axial type electronic component to the board.

19 Claims, 6 Drawing Sheets

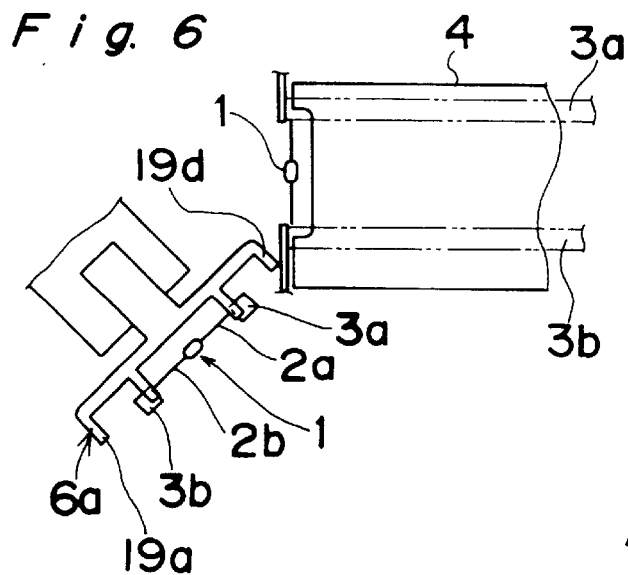
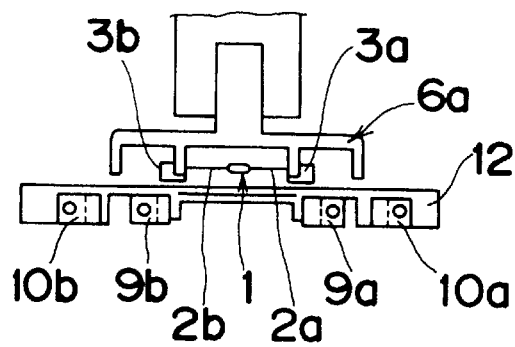
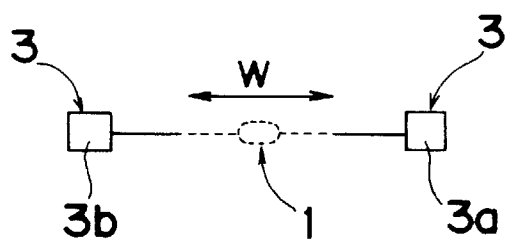
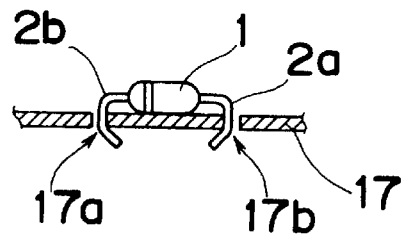

AXIAL TYPE ELECTRONIC COMPONENT INSERTING METHOD AND APPARATUS

BACKGROUND OF THE INVENTION

The present invention relates to an axial type electronic component inserting method and apparatus for automatically inserting lead wires of an axial type electronic component into specified holes of a board.

As shown in FIG. 11A, axial type electronic components are assembled with their pairs of lead wires 2a and 2b, extending from electronic component bodies 1a arranged at regular intervals of d1 and taped at both ends by tapes 3a and 3b. It is known that such an assembly of axial type electronic components 1, taped at regular intervals as described above, is subjected to an inserting process by an apparatus as disclosed in Japanese Patent Laid-Open Publication No. 1-305600.

A component supplier 4 as shown in FIG. 12 retains such an assembly of axial type electronic components 1. It is provided with cutters 5a and 5b for cutting the tapes 3a and 3b that are taping the lead wires 2a and 2b of the axial type electronic components 1.

Taped end portions including the lead wires of the assembly of the axial type electronic components 1 retained by the component supplier 4 are grasped and pulled by chuck pieces 6 of a component carrier 7. The tapes 3a and 3b are cut by the cutters 5a and 5b of the component supplier 4 so that one axial type electronic component 1 is taken out.

The axial type electronic component 1 that has been taken out is grasped by its end portions by the chuck pieces 6, and then carried by the component carrier 7 to an inserting position.

A component inserter 11 as shown in FIG. 13 receives the axial type electronic component 1 from the component carrier 7 in the inserting position, cuts both the ends of the lead wires 2a and 2b including the lead taping portions of the axial type electronic component 1, bends the extending lead wires 2a and 2b at both ends to a desired width, and inserts the extreme end portions of the lead wires into specified holes of a board.

In the prior art shown in FIGS. 12 and 13, the component inserting process has been successively performed by reciprocating one component carrier 7 between the component supplier 4 that retains the axial type electronic components 1 and the component inserter 11 that inserts each axial type electronic component 1.

Furthermore, according to the Japanese Patent Laid-Open Publication No. 1-305600, its component carrier is constructed so that it can mount another chuck piece for grasping even a radial type electronic component in addition to the axial type electronic component.

According to the above-mentioned conventional construction, it has been very difficult to reduce the insertion cycle because the axial type electronic component supplying and inserting operations are executed alternately one after another. In other words, since the axial type electronic components are fetched or taken out one by one, there is a process in which the component carrier returns unloaded. This has occupied a great part of the component insertion cycle time, and has been problematic lately when mass production is required in a short time.

Furthermore, in the case of a component grasping device for grasping even a radial type electronic component, in addition to the axial type electronic component, as disclosed in the Japanese Patent Laid-Open Publication No. 1-305600, there is the issue that the device cannot manage axial type electronic components having different tape intervals (e.g., a tape interval of 26 mm and a tape interval of 52 mm as indicated by d2 in FIG. 11A).

SUMMARY OF THE INVENTION

Accordingly, an object of the present invention is to provide an axial type electronic component inserting method and apparatus capable of improving an axial type electronic component inserting efficiency and managing axial type electronic components having different tape interval specifications.

In accomplishing these and other aspects, according to one aspect of the present invention, there is provided an axial type electronic component inserting method for inserting, into specified holes of a board, an axial type electronic component having a pair of lead wires extending from a main body of the electronic component, belonging to an assembly of electronic components which are connected by a tape and arranged at regular intervals. A plurality of chucks are intermittently moved to a component supplying position and a component transferring position, respectively. One of the components is taken out from a component supplying device retaining the assembly of axial type electronic components connected by the tape while one of the chucks grasps end portions of the assembly at the component supplying position. The chuck which has already grasped the axial type electronic component through the first process is moved to a component inserting device, and delivers the axial type electronic component to the component inserting device from the chuck.

The first process and the component delivering process are simultaneously executed.

According to another aspect of the present invention, there is provided an axial type electronic component inserting apparatus for inserting into specified holes of a board an axial type electronic component having a pair of lead wires extending from a main body of the electronic component. The electronic component belongs to an assembly of electronic components which are connected by a tape and arranged at regular intervals. Each of a plurality of chucks can move forward and backward while grasping end portions of the axial type electronic component. A component carrying device is provided with the chucks arranged at regular intervals in a circular form, and each operates intermittently so that each chuck stops at least in a component supplying position and a component transferring position. A component supplying device is provided with a cutter for cutting the tape connecting the assembly of axial type electronic components and operates to supply each axial type electronic component to each chuck located in the component supplying position. A component transferring and inserting device receives the axial type electronic component from each chuck located in the component transferring position, inserts both the ends of the lead wires into the specified holes of the board, and bends the lead wires underneath the board so as to fix the axial type electronic component to the board.

According to a further aspect of the present invention, there is provided the axial type electronic component inserting apparatus, wherein the component transferring and inserting device comprises a component transferring device which receives each axial type electronic component from each chuck located in the component transferring position and transfers the axial type electronic component to a component inserting position, and a component inserting device which receives the axial type electronic component from the component transferring device in the component inserting position, inserts both the ends of the lead wires into the specified holes of the board, and bends the lead wires underneath the board so as to fix the axial type electronic component to the board.

BRIEF DESCRIPTION OF THE DRAWINGS

These and other aspects and features of the present invention will become clear from the following description taken in conjunction with preferred embodiments thereof and with reference to the accompanying drawings, in which:

FIG. 6 is a top view of a turning operation of a carrying device of the apparatus;

FIG. 7 is a side view of transfer of an axial type electronic component in the apparatus;

FIG. 8 is a conceptual view of the cutting of lead wires;

FIG. 9 is a sectional view of the fixing of an axial type electronic component;

DETAILED DESCRIPTION OF THE PREFERRED EMBODIMENTS

Figure 1:
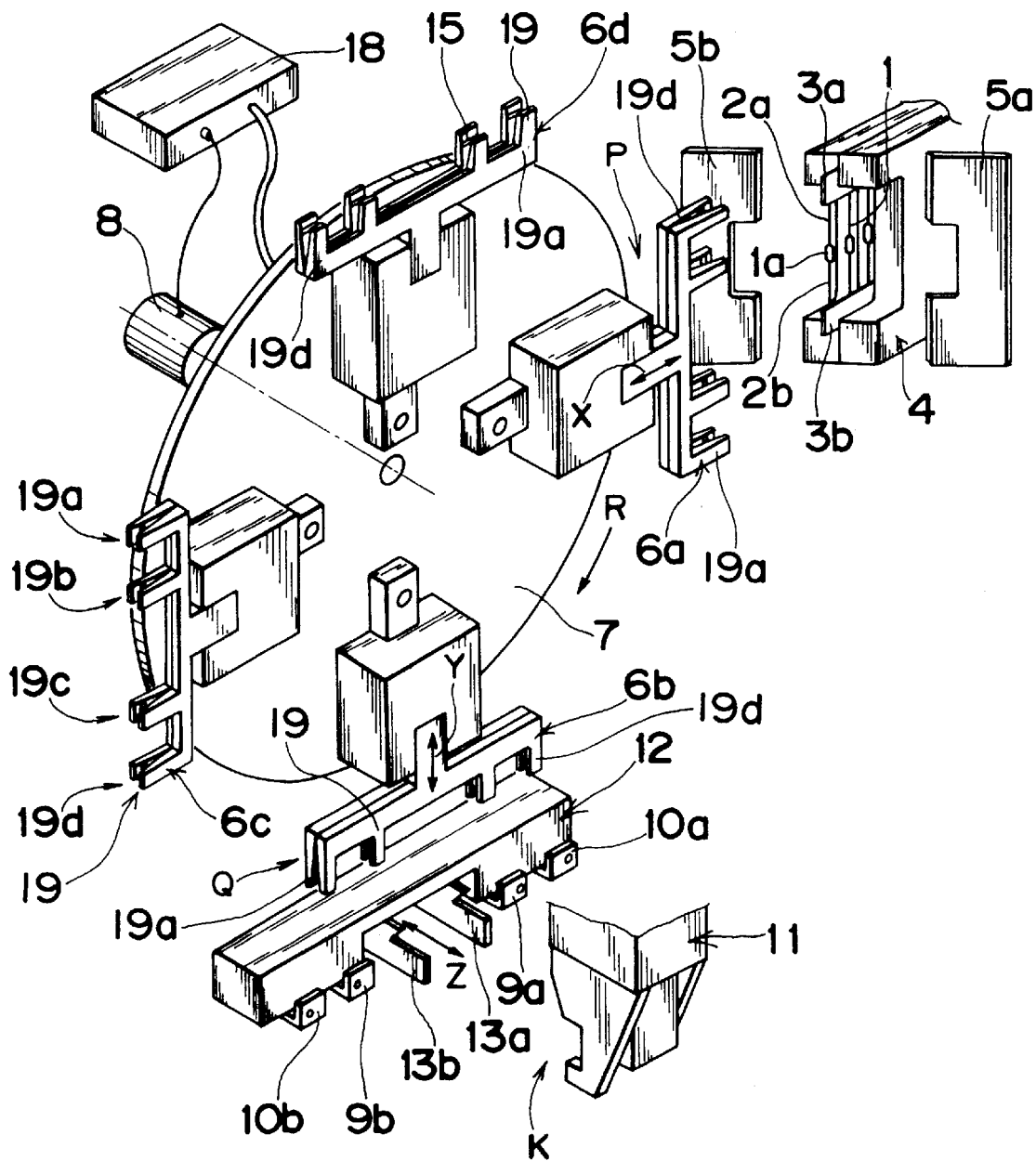
FIG. 1 is a schematic diagram showing an axial type electronic component inserting apparatus according to an embodiment of the present invention.

Before description of the present invention proceeds, it is to be noted that like parts are designated by like reference numerals throughout the accompanying drawings.

Embodiments of the present invention will be described in detail below with reference to the accompanying drawings.

An axial type electronic component inserter of an embodiment of the present invention as shown in FIG. 1 comprises a supplying device 4 which stores an assembly of axial type electronic components having a tap interval of 26 mm as one example and includes cutters 5a and 5b for cutting tapes 3a and 3b that tape lead wires 2a and 2b of each axial type electronic component 1. The cutters 5a and 5b are driven by driving devices such as solenoids or cylinders under the control of a controller 18 described below.

Figure 2A:
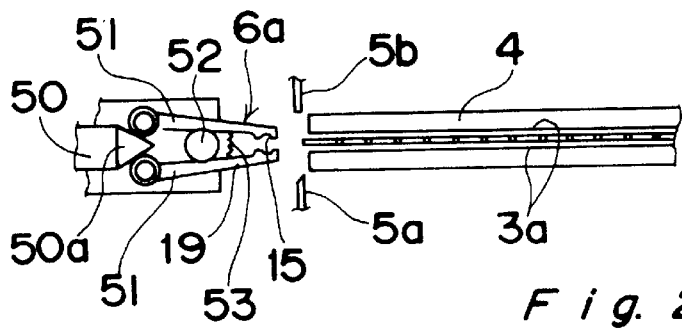
FIG. 2A is a side view of a chucking operation of a supplying device of the apparatus.
Figure 3A:
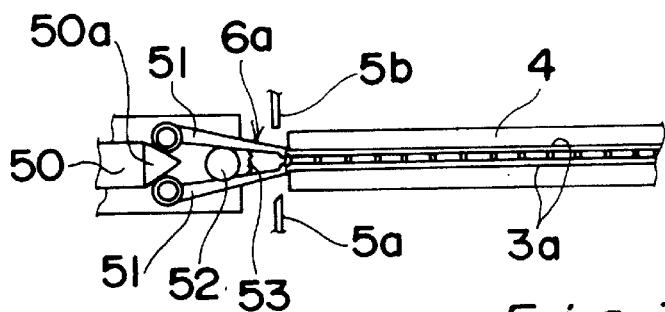
FIG. 3A is a side view of a chucking operation of the supplying device.
Figure 3B:
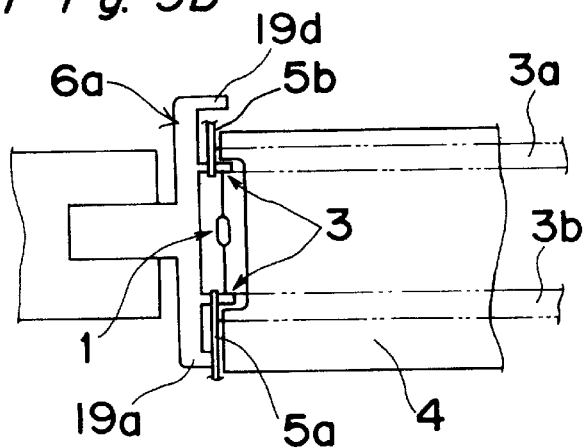
FIG. 3B is a top view of a chucking operation of the supplying device.
Figure 4A:
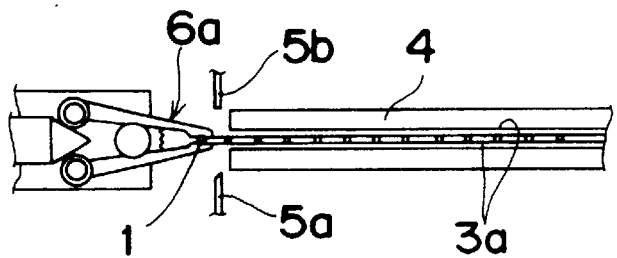
FIG. 4A is a side view of a chucking operation of the supplying device.
Figure 5A:
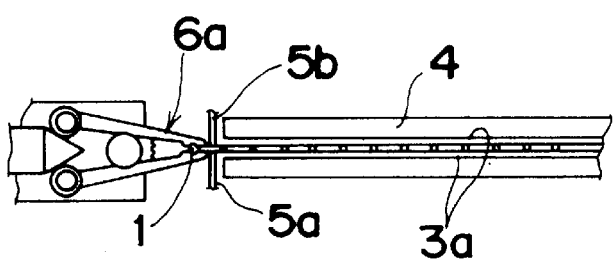
FIG. 5A is a side view of a chucking operation of the supplying device.

A circular table (carrying device) 7 is provided with four chucks 6a, 6b, 6c, and 6d that hold the taped portions including the lead wires of the axial type electronic component assembly stored in the supplying device 4 with protruding pieces 19, each having a grasping groove 15, and take out axial type electronic components 1 at intervals of each component. The chucks 6a through 6d are successively shifted to specified station positions by intermittently turning in a direction of R. Each chuck has a pair of chucking elements 51 capable of reversibly rotating around a fulcrum 52 against an urging force of a compression spring 53 or by the urging force so as to hold the tape 3 with or release the tape 3 from the holding ends of the elements 51. A wedge element 50 has at its tip end a wedge portion 50a capable of being inserted into or retreated from between the other ends of the chucking elements 51 so as to rotate the elements 51 for holding the tape 3 with or releasing the tape 3 from the holding ends of the chucking elements 51. That is, when the tape 3 is held by the holding ends of the elements 51 as shown in FIGS. 2A, 3A, 4A, and 5A, the wedge portion 50a of the wedge element 50 is firstly retreated from between the other ends of the elements 51 to open the holding ends of the elements 51 by the urging force of the spring 53 and then, after the tape 3 is located between the opened holding ends of the elements 51, the wedge portion 50a is inserted between the other ends of the elements 51, and then the holding ends of the elements 51 are closed and the tape 3 is held therebetween against the urging force of the spring 53 as shown in FIGS. 3A, 4A, and 5A. On the other hand, when the tape 3 is released from the holding ends of the elements 51, the wedge portion 50a is retreated from the other ends of the elements 51 to open the holding ends of the elements 51.

An inserting device 11 has a transferring device 12 which receives each axial type electronic component 1 grasped by any of the chucks 6a through 6d provided on the circular table 7. Its cuts both ends of the lead wires 2a and 2b, including the taped lead portions of each axial type electronic component 1 set on the transferring device 12, bends the lead wires 2a and 2b extending from the electronic component body 1a to a specified width, and then inserts the lead wire ends of the axial type electronic component 1 into specified holes of a board. The respective concrete operations of the inserting device 11 is described in U.S. patent applications Ser. Nos. 08/594,518 and 08/605,774.

Further, the four chucks 6a through 6d on the circular table 7 are arranged so that two of any of them are simultaneously positioned in a component supplying station position P of the supplying device 4 and a component transferring station position Q of the transferring device 12 by an intermittent turning operation of an AC servomotor 8. The supplying device 4, the circular table 7, and the inserting device 11 are each controlled by a controller 18 which synchronously executes the supplying and inserting operations of the axial type electronic components 1. The operation of the transferring device 12 can be also controlled by the controller 18 so as to cooperate with the inserting device 11 and the circular table 7.

Each of the chucks 6a through 6d is provided with four protruding grasping pieces (component grasping device) 19a through 19d so that they can grasp an axial type electronic component 1 having a varied tape interval. For example, a pair of protruding grasping pieces 19a and 19d located outwardly are to grasp an axial type electronic component 1 having a tape interval of 52 mm, while a pair of protruding grasping pieces 19b and 19c located inwardly are to grasp an axial type electronic component 1 having a tape interval of 26 mm. These protruding grasping pieces 19a through 19d are constructed so that they can grasp a component having either tape interval. Furthermore, the chucks 6a through 6d are constructed so that they can advance and retreat, as indicated by arrows X and Y, with respect to the position of the supplying device 4 and the position of the transferring device 12 in the component supplying station position P and the component transferring station position Q, respectively, by driving devices such as cylinders or solenoids under the control of the controller 18.

Further, the transferring device 12 is provided with a pair of centering chucks (centering pieces) 13a and 13b for centering the position of the main body of each set axial type electronic component 1. The pair of centering chucks 13a and 13b, provided in center positions for holding each component, adjusts the axial type electronic component 1 that has been from both the ends of the component 1 delivered to retaining pieces 9a and 9b or 10a and 10b provided at the transferring device 12 so as to correct the position of the component 1. That is, the centering chucks 13a and 13b are arranged and are movable in a symmetrical manner with respect to the center of the transferring device 12. Thus, if the component 1 is received by the centering chucks 13a and 13b and the retaining pieces 9a and 9b or 10a and 10b with the component 1 shifted from the center of the transferring device 12, the centering chucks 13a and 13b are simultaneously moved in directions to come closer to each other and one of the centering chucks 13a and 13b contacts and moves the component 1 toward the other chuck. Then, finally, the component 1 is held between the centering chucks 13a and 13b with the component centered with respect to the center of the transferring device 12. The pair of retaining pieces 10a and 10b located outwardly and the retaining pieces 9a and 9b located inwardly are arranged so that they correspond to the pair of protruding grasping pieces 19a and 19d located outwardly and the pair of protruding grasping pieces 19b and 19c located inwardly, respectively, and are constructed so that they can advance and retreat in a direction as indicated by an arrow Z to the inserting device 11 while holding the axial type electronic component 1.

The principle of operation of the axial type electronic component inserting apparatus constructed as above will be described with reference to FIGS. 2A through 10.

The operation from a state in which the chuck 6a shown in FIG. 1 is stopped in the component supplying station position P and the chuck 6b is stopped in the component transferring station position Q (in the condition of process F) will be described below.

Figure 2B:
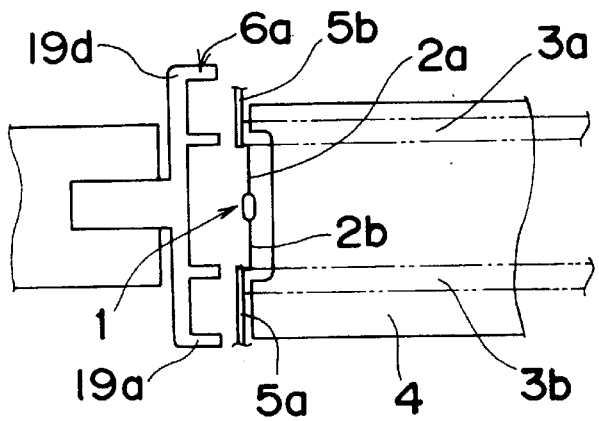
FIG. 2B is a top view of the chucking operation of the supplying device.
Figure 10:
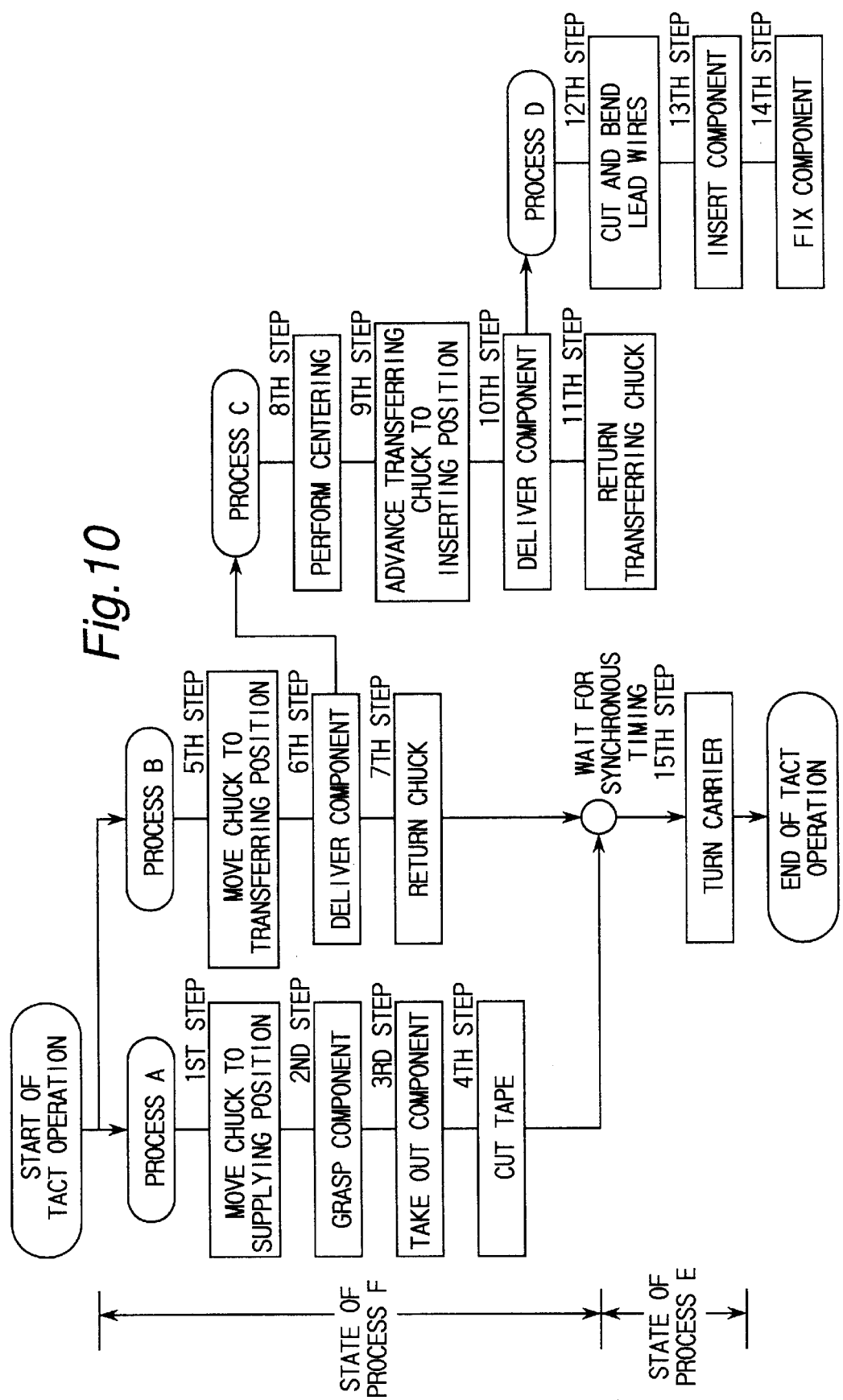
FIG. 10 is a flowchart of an operational example of an axial type electronic component inserting method according to an embodiment of the present invention.

In the component supplying station position P, a component taking-out process (process A) is executed in 1st to 4th Steps in FIG. 10. That is, upon receiving a start command from the controller 18, the chuck 6a advances in the direction as indicated by the arrow X in FIG. 1 while opening the ends of the protruding pieces 19 having the grasping grooves 15 as shown in FIGS. 2A and 2B so as to grasp the lead wires 2a and 2b of the axial type electronic component 1 retained in the supplying device 4 including the portions taped by the tapes 3a and 3b which wrap the lead wires 2a and 2b (1st Step). After advancing to a specified position (a supplying position) at the supplying device 4, the chuck 6a grasps the taped portions 3 at both the ends of the axial type electronic component 1 (2nd Step).

Figure 4B:
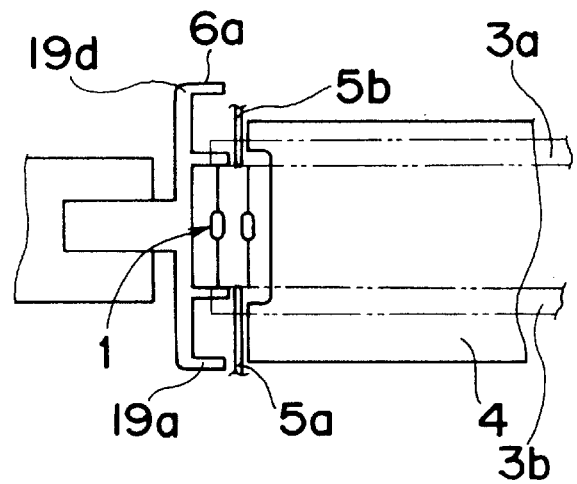
FIG. 4B is a top view of the chucking operation of the supplying device.

Then, the chuck 6a that is grasping the taped portions 3 at both the ends of the axial type electronic component 1 retreats while grasping the axial type electronic component 1, so that it takes out the axial type electronic component 1 as shown in FIG. 4A and 4B by a specified pitch corresponding to the interval between the components 1 (3rd Step). At this time, for example, the supplying device 4 intermittently holds and releases the tapes 3 connected to the axial type electronic components 1 in accordance with the component taking-out operation.

Figure 5B:
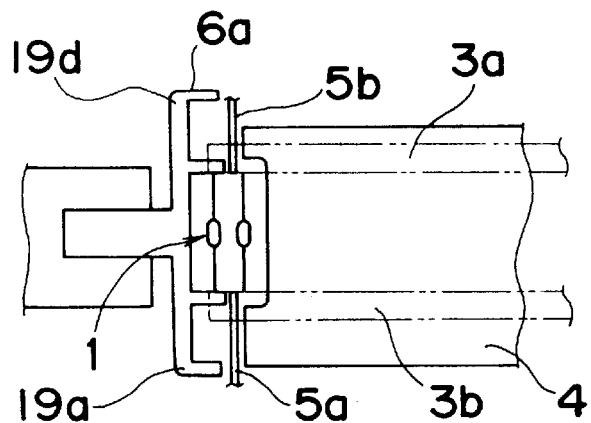
FIG. 5B is a top view of the chucking operation of the supplying device.
Figure 11A:
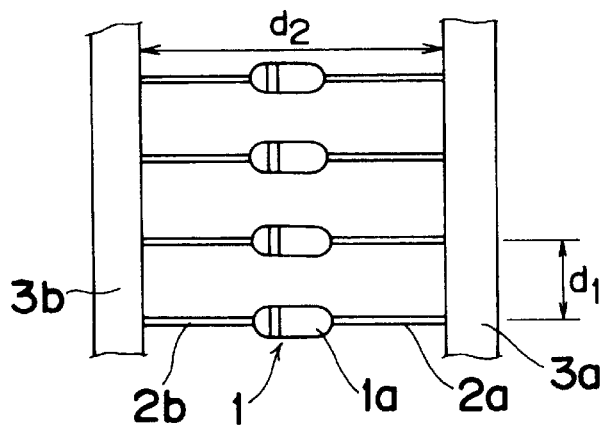
FIG. 11A is a schematic view of an assembly of axial type electronic components.
Figure 11B:
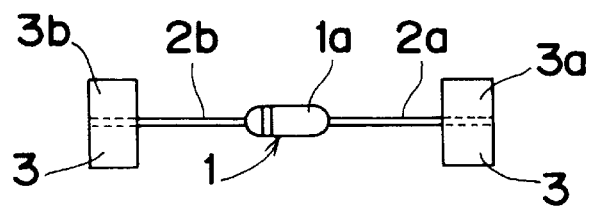
FIG. 11B is a structural view of an axial type electronic component.
Figure 12:
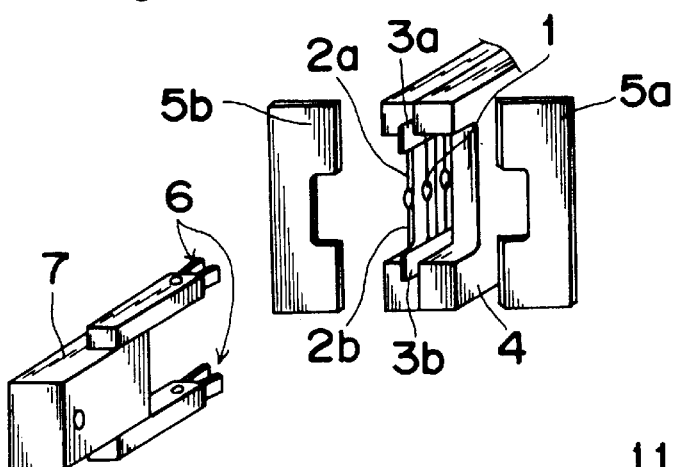
FIG. 12 is a perspective view of a component supplier of the prior art.
Figure 13:
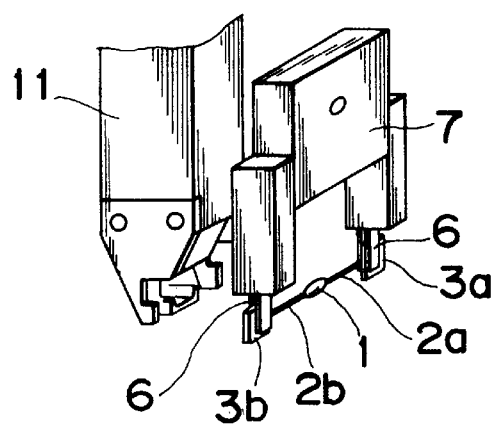
FIG. 13 is a schematic view of a component inserter of the prior art.

The axial type electronic component 1 that has been taken out is subjected to cutting of the tapes 3a and 3b by the cutters 5a and 5b as shown in FIGS. 5A and 5B (4th Step). By this cutting operation, the axial type electronic component 1 grasped by the chuck 6a is taken out in a state in which it is separated as shown in FIG. 11B from a state in which it is connected with the other by the tapes 3a and 3b as shown in FIG. 11A.

Meanwhile, in the component transferring station position Q, a component transferring process (process B) as shown in 5th Step through 7th Step is executed. That is, the chuck 6b has already undergone the 1st Step through 4th Step (process A), and the chuck 6b has moved to the component transferring station position Q while grasping the axial type electronic component 1. Upon receiving a start command from the controller 18, the chuck 6b starts the operation of the component transferring process (process B) concurrently with the process A in a manner as follows.

That is, the chuck 6b advances in the direction as indicated by the arrow Y in FIG. 1 (5th Step). When the chuck 6b moves to the component transferring position, the axial type electronic component 1 grasped by the chuck 6b is delivered to the transferring device 12. The transferring device 12 catches the axial type electronic component 1 as shown in FIG. 7 by the transferring chucks 9a and 9b and the centering chucks 13a and 13b, so that the transferring device 12 receives the axial type electronic component 1 upon release of grasp and a retreating motion of the chuck 6b (6th Step).

The axial type electronic component 1 received by the transferring chucks 9a and 9b is subjected to centering position correction by the centering chucks 13a and 13b simultaneously with the release of grasp of the chuck 6b in a process C as follows (8th Step).

Upon confirming the reception of the component 1 by the transferring device 12, the chuck 6b immediately retreats to return to its original position (7th Step).

Upon detecting the completion of the component transferring process (process B), the controller 18 outputs an operation command of a component transporting process (process C) as in subsequent 8th Step through 10th Step. That is, the centering operation as described above is performed in 8th Step, and the transferring device 12 advances the axial type electronic component 1 in the direction of Z in FIG. 1 to an inserting position as indicated by K in FIG. 1 while holding the axial type electronic component 1 with the transferring chucks 9a and 9b and the centering chucks 13a and 13b (9th Step). Then, the axial type electronic component 1 is delivered to the inserting device 11 in the 10th Step.

Upon detecting the completion of the 10th Step of the component transporting process (process C), the controller 18 outputs an operation command of a component inserting process (process D) as indicated by a 12th Step through 13th Step. That is, the inserting device 11 starts a component receiving process D for receiving the axial type electronic component 1 held by the transferring chucks 9a and 9b and the centering chucks 13a and 13b.

Upon the start of the process D, the transferring device 12 return to its original position (11th Step).

Further, upon detecting the completion of both the 4th Step of the component taking-out process (process A) and the 7th Step of the component transferring process (process B) concurrently with the above-mentioned process C and the process D, the controller 18 outputs an operation command of a carrier turning process (a state of process E). That is, a turn command of the controller 18 is outputted to the AC servomotor 8, so that the circular table 7 is turned by an angle of 90° in the direction as indicated by the arrow R in FIG. 1 (15th Step). By this operation, the chuck 6a in the component supplying station position P turns by an angle of 90° while grasping the axial type electronic component 1 and then stops in the component transferring station position Q. Meanwhile, the chuck 6b located in the component transferring station position Q turns by an angle of 90° in a similar manner and then stops in the next station. Meanwhile, the chuck 6c and the chuck 6d move to the respective subsequent station positions, so that the chuck 6d stops in the component supplying station position P.

Also, in the process D, the inserting device 11 cuts the lead wires 2a and 2b of the axial type electronic component 1 to a specified length as indicated by W in FIG. 8 concurrently with the aforementioned processes, and then bends the lead wires 2a and 2b to a specified width (12th Step). The thus processed axial type electronic component 1 is inserted into holes 17a and 17b of a board 17 as shown in FIG. 9 (13th Step). Subsequently, the inserted lead wires 2a and 2b of the axial type electronic component 1 are further bent on the rear surface of the board 17 so as to be fixed onto the board 17 (14th Step).

Thus, the work of the process B is executed concurrently with the process A in the state of the process F, and then the table 7 is turned in the state of the process E. Meanwhile, the works of the process C and the process D are concurrently executed, so that one tact operation as described above is completed.

Even when the components are changed to axial type electronic components 1 having a varied tape interval of 52 mm, though the case is not shown in FIG. 1, such an axial type electronic component 1 having a varied specification can be easily inserted according to the above embodiment.

Furthermore, the aforementioned series of processes A through D as shown in FIG. 10 are satisfactorily timed by confirming the progress of each process based on signal conditions.

As described above, according to the aforementioned embodiment, the process E is executed after the process A and the process B are completed independently of the execution of the process C, thereby allowing the subsequent tact operation to be started. This arrangement means that the existence of the plurality of chucks 6a through 6d and the transferring device 12 enables the operations of the process A, process B, and the process E independently of the operation of the process C, thereby efficiently supplying each component 1 to the inserting device 11. Therefore, the supply of each component 1 to the inserting device 11 can be smoothly performed successively without any extra wait time, and therefore the efficiency of insertion of the axial type electronic components 1 can be substantially improved.

The operations, for example, for confirming the reception of the component 1 by the transferring device 12 at the 7th Step, detecting the completion of the component transferring process (process B), detecting the completion of the 10th Step of the component transporting process (process C), detecting the completion of both the 4th Step of the component taking-out process (process A) and the 7th Step of the component transferring process (process B) concurrently with the above-mentioned process C and the process D can be performed by receiving signals outputted by sensors for detecting the respective operations.

The method of the embodiment of the present invention can operate as follows. That is, the process E in which the carrying device provided with the plurality of chucks moves and the process F in which the carrying device stops the chucks at least in the component supplying position and the component transferring position are alternately executed, the process A in which the chuck which stops in the component supplying position takes out an axial type electronic component from the component supplying device is executed within the process F, and the process B in which the axial type electronic component grasped through the process A is delivered to the component transferring device is executed concurrently with the above operation. Further, the process C in which the component transferring device delivers the axial type electronic component to the component inserting device through the process B is completed by a time when the chuck located in the component transferring position is put into a state in which the chuck becomes capable of delivering the axial type electronic component to the component transferring device in the process B of the next component inserting cycle. Then, the process D in which the axial type electronic component is fixed to the board through the process C is completed by a time when the component transferring device is put into a state in which the component transferring device becomes capable of delivering the axial type electronic component to the component inserting device in the process C of the next cycle. Therefore, the taking-out operation and the delivering operation of axial type electronic components can be simultaneously performed by different chucks. Furthermore, the process B is completed when the axial type electronic component is delivered to the component transferring device. Therefore, the operation of the component carrying device is enabled with completion of the process A with no wait for. the inserting work of the component inserting device, so that the movement of unloaded chucks and the movement of the next component can be performed by means of the plurality of chucks. Therefore, the processing time can be substantially reduced, and the component inserting device can execute the process D by successively receiving axial type electronic components efficiently by the process C in which the axial type electronic components are transferred by the component transferring device.

In the case where the position of the axial type electronic component delivered to the component transferring device is centered by adjusting the main body of the component from both sides in the process B in which the axial type electronic component grasped by the chuck is delivered to the component transferring device, the center position of the component can be seized to allow centering correction to be surely achieved independently of the size of the main body of the component.

The apparatus of the embodiment of the present invention comprises chucks constructed so that each of the chucks can move forward and backward while grasping the end portions of each axial type electronic component. A component carrying device is provided with the chucks arranged at regular intervals in a circular form and each of the chucks operates intermittently by stopping the chucks at least in a component supplying position and a component transferring position. A component transferring device receives each axial type electronic component from each chuck located in the component transferring position and carries the axial type electronic component to a component inserting position. A component inserting device receives the axial type electronic component from the component transferring device in the component inserting position and fixes the axial type electronic component to the board. With the above arrangement, the component supplying and transferring operations can be executed synchronously by the plurality of chucks which are arranged in a circular form and some of which stop at least in the component supplying position and the component transferring position upon the turning operation of the component carrying device. Furthermore, the existence of the component transferring device allows the intermittent turning operation of the component carrying device to be achieved efficiently, thereby producing the same effect as that of the method of the embodiment of the present invention.

Furthermore, when each chuck serving as a component grasping device for grasping each axial type electronic component is provided with plural pairs of protruding grasping pieces corresponding to different tape intervals for concurrently grasping the tapes and lead wires of an axial type electronic component having a varied tape interval, the component transferring device is provided with retaining pieces corresponding to the protruding grasping pieces of the component grasping device. The component transferring device is provided with centering pieces for centering the axial type electronic component by adjusting the main body of a set axial type electronic component from both sides. Thus axial type electronic components having different tape intervals can be easily transferred by the plural pairs of protruding grasping pieces and the retaining pieces corresponding to each taping interval. Furthermore, the centering pieces center the axial type electronic component by adjusting the main body of the axial type electronic component set in the transferring device from both sides. Therefore, the centering can be correctly achieved even when the main body of the electronic components varies in size or has a varied tape interval, thereby allowing components having different specifications to be inserted by simple mechanism at low cost.

Four chucks 6a through 6d are employed in the present embodiment, however, there may be employed any number of chucks so long as the number is not smaller than two and the chucks can position components 1 simultaneously in both the supplying device 4 and the inserting device 11. Furthermore, the supplying device 4 and the inserting device 11 are not required to be placed in adjacent station positions, and they may be placed in positions opposite to each other at an angle of 180°. Furthermore, the tape interval is limited neither to the interval of 26 mm nor to the interval of 52 mm, and the chuck 6 may be provided with two or more pairs of protruding pieces 19. Furthermore, the centering chucks 13a and 13b are operated according to the description of the operation of the aforementioned embodiment, however, they are not required to operate in the case of components which require no centering operation. In other words, the present invention is not limited to the aforementioned embodiment but accepts a variety of modifications based on the concept of the present invention, meaning that such modifications are not excluded from the scope of the present invention.

According to the present invention, there can be provided an axial type electronic component inserting method and apparatus capable of concurrently performing a plurality of processes through reduction of wasteful blank time by means of the plurality of chucks and the transferring device so as to improve the efficiency of insertion of axial type electronic components, and easily managing axial type electronic components having different tape interval specifications by means of the plurality of grasping pieces provided at the chuck and the plurality of retaining pieces or the centering chucks provided at the transferring device.

What is claimed is:

1. A method of inserting an axial type of electronic component into specified holes of board, comprising:

i) taking out an axial type of electronic component from a component supplying device, which retains an assembly of axial type electronic components arranged at regular intervals and connected together at lead wires thereof by tape, with a first of a plurality of chucks, capable of being intermittently moved between a component supplying position and a component transferring position, that is located at the component supplying position while the first of the plurality of chucks grasps end portions of the assembly; and ii) moving a second one of the plurality of chucks, capable of being intermittently moved between a component supplying position and a component transferring position that is located at the component transferring position and that has already performed i) and which is already grasping an axial type of electronic component, to a component inserting device, and delivering the axial type of electronic component grasped by the second one of the plurality of chucks to the component inserting device from the second one of the plurality of chucks;

wherein i) and ii) are executed simultaneously.

2. The method of claim 1, wherein i) further includes:

before the step of taking out, stopping the first of the plurality of chucks at the component supplying position and grasping the end portions of the assembly; and after the step of taking out, cutting the tape which connects the lead wires of the electronic components of the assembly together so as to separate one of the axial type electronic components from the assembly.

3. The method of claim 2, wherein ii) includes:

ii) a) moving the second one of the plurality of chucks to the component transferring position, and ii) b) delivering the axial type of electronic component grasped by the second one of the chucks to a component transferring device; and ii) c) delivering the axial type of electronic component to the component inserting device from the component transferring device when the component transferring device has received the axial type of electronic component through ii) a) and ii) b).

4. The method of claim 3, and further comprising:

iii) inserting both ends of lead wires of the axial type of electronic component that has been received by the component inserting device into the specified holes of the board, and bending the lead wires underneath the board to fix the lead wires to the board;

wherein i)–iii) constitute a component inserting cycle and are repeated in subsequent component inserting cycles;

wherein ii) c) has been completed in a prior component inserting cycle by the time when one of the plurality of chucks located in the component transferring position in a subsequent component inserting cycle, acting as the second one of the plurality of chucks in steps ii) a) and b), is prepared to deliver a subsequent axial type of electronic component to the component transferring device;

wherein iii) has been completed for a prior component inserting cycle by the time when the component transferring device is prepared to deliver the subsequent axial type electronic component to the component inserting device in step ii) c) of a subsequent component inserting cycle.

5. The method of claim 4, and further comprising:

iv) intermittently moving the plurality of chucks with a carrying device such that at least one of the plurality of chucks moves to the component supplying position and at least one of the plurality of chucks moves to the component transferring position; and v) stopping the plurality of chucks with the carrying device such that one of the plurality of chucks is stopped at the component supplying position and another of the plurality of chucks is stopped at the component transferring position;

wherein steps iv) and v) are executed alternately, and step i) is executed during step v) concurrently with execution of steps ii) a) and ii) b).

6. The method of claim 5, wherein step ii) c) comprises the component transferring device centering the axial type of electronic component by adjusting a main body of the axial type of electronic component.

7. The method of claim 6, wherein in step ii) c), the step of adjusting the main body further comprises moving centering chucks from both sides of the main body.

8. The method of claim 3, wherein step ii) c) comprises the component transferring device centering the axial type of electronic component by adjusting a main body of the axial type of electronic component.

9. The method of claim 8, wherein in step ii) c), the step of adjusting the main body further comprises moving centering chucks from both sides of the main body.

10. The method of claim 4, wherein step ii) c) comprises the component transferring device centering the axial type of electronic component by adjusting a main body of the axial type of electronic component.

11. The method of claim 10, wherein in step ii) c), the step of adjusting the main body further comprises moving centering chucks from both sides of the main body.

12. An electronic component inserting apparatus for inserting axial type electronic components into specified holes of a board, the axial type electronic component having a pair of lead wires extending from a main body and being supplied from an assembly of electronic components in which the electronic components are connected together by a tape at regular intervals, said apparatus comprising:

a plurality of chucks each constructed so as to be capable of moving backward and forward;

a component carrying device having said plurality of chucks arranged thereon at regular intervals and in a circular form, said component carrying device being capable of moving said plurality of chucks between, and stopping said plurality of chucks at, a component supplying position and a component transferring position;

a component supplying device located adjacent to said component carrying device and said component supplying position for supplying the axial type electronic components from the assembly to ones of said plurality of chucks positioned at said component supplying position by said component carrying device, said component supplying device having a cutter for cutting the tape connecting the assembly of axial type electronic components; and a component transferring and inserting arrangement located adjacent to said component carrying device and said component transferring position which is capable of receiving an axial type electronic component from each of said plurality of chucks when located at said component transferring position and mounting the axial type electronic component to the board.

13. The apparatus of claim 12, wherein said component inserting arrangement comprises:

a component transferring device having a portion that receives an axial type electronic component from each of said plurality of chucks when located at said component transferring position, said component transferring device being capable of moving an axial type electronic component that has been received by said portion to a component inserting position; and a component inserting device capable of receiving the axial type electronic component that has been moved to the component inserting position, inserting both ends of the lead wires of the axial type electronic component into the specified holes of the board and bending the lead wires underneath the board so as to fix the axial type electronic component to the board.

14. The apparatus of claim 13, wherein:

each of said plurality of chucks comprises a plurality of protruding grasping pieces that correspond to different tape intervals; and said component transferring device comprises a plurality of retaining pieces at said portion thereof corresponding to said plurality of protruding grasping pieces.

15. The apparatus of claim 14, wherein each of said plurality of chucks comprises at least two protruding grasping pieces corresponding to one tape interval and two protruding grasping pieces corresponding to a different tape interval.

16. The apparatus of claim 15, wherein said plurality of retaining pieces of said component transferring device correspond in number and position to said plurality of grasping pieces.

17. The apparatus of claim 14, wherein said component transferring device comprises centering pieces adjacent to said portion for centering an axial type electronic component by adjusting the main body of the axial type electronic component from the sides thereof.

18. The apparatus of claim 13, wherein said component transferring device comprises centering pieces adjacent to said portion for centering an axial type electronic component by adjusting the main body of the axial type electronic component from the sides thereof.

19. The apparatus of claim 13, wherein said component inserting device is capable of cutting both ends of lead wires of an axial type electronic component and bending the extending lead wires to a desired width before inserting both the ends of the lead wires into the specified holes of the board.

* * * * *

UNITED STATES PATENT AND TRADEMARK OFFICE
CERTIFICATE OF CORRECTION

PATENT NO. : 5,864,945
DATED : February 2, 1999
INVENTOR(S) : Kiyoshi IMAI

It is certified that error appears in the above-indentified patent and that said Letters Patent is hereby corrected as shown below:

On the title page change item (73) from "Matsushita Electic Industrial Co., Ltd." to --Matsushita Electric Industrial Co., Ltd.--.

Signed and Sealed this

Twenty-first Day of September, 1999

Attest:

Q. TODD DICKINSON

*Attesting Officer*  *Acting Commissioner of Patents and Trademarks*